United States Patent [19]

Skeie

[11] Patent Number: 4,661,738

[45] Date of Patent: Apr. 28, 1987

[54] COMPENSATION TECHNIQUES FOR TEMPERATURE EFFECTS AND NON-UNIFORM AMPLITUDE DISTRIBUTIONS IN SAW DEVICES

[75] Inventor: Halvor Skeie, San Jose, Calif.

[73] Assignee: Crystal Technology, Inc., Palo Alto, Calif.

[21] Appl. No.: 780,513

[22] Filed: Sep. 26, 1985

[51] Int. Cl.$^4$ ............................................. H01L 41/08
[52] U.S. Cl. ................................. 310/313 D; 310/346; 333/155; 333/195
[58] Field of Search ............... 310/313 R, 313 D, 346; 333/153, 155, 195

[56] References Cited

U.S. PATENT DOCUMENTS

| | | | |
|---|---|---|---|
| 3,753,164 | 8/1973 | De Vries | 310/313 D X |
| 3,978,437 | 8/1976 | Paige | 310/313 D X |
| 4,166,228 | 8/1979 | Solie | 310/313 D |
| 4,210,883 | 7/1980 | Shah et al. | 310/313 D X |
| 4,319,154 | 3/1982 | Solie | 310/313 D |
| 4,349,794 | 9/1982 | Kagiwada | 333/195 X |

OTHER PUBLICATIONS

Reflective Surface Acoustic Wave Delay Line Material Parameters, by Meyer et al., IEEE Ultrasonics Symposium Proceedings 1973, pp. 500–502.

Primary Examiner—Mark O. Budd
Attorney, Agent, or Firm—John Francis Moran

[57] ABSTRACT

A SAW device using a first reflector (13) and a second reflector (14) is arranged to provide compensation for temperature effects. The temperature effects are due to the anisotropic characteristics of piezoelectric material commonly used as the substrate and wave medium for the acoustic waves in the SAW devices. These materials typically exhibit a temperature dependent, preferential direction of transmission which if not compensated results in a temperature dependent signal attenuation. An additional technique using a non-reflective portion 22 offsets non-uniformity which occurs in the amplitude distribution of the reflected acoustic wave. Each reflector (13 and 14) may include its respective non-reflective portion ($A_1$ and $A_2$).

15 Claims, 13 Drawing Figures

COMPENSATION TECHNIQUES FOR TEMPERATURE EFFECTS AND NON-UNIFORM AMPLITUDE DISTRIBUTIONS IN SAW DEVICES

BACKGROUND OF THE INVENTION

This invention relates to surface acoustic wave (SAW) devices. More particularly, the invention relates to a SAW filter type utilizing a slant reflector pair arranged to provide compensation for temperature dependent signal attenuation which results from instability in the transmission characteristics of piezoelectric material due to temperature dependence.

In order to reduce insertion losses in conventional SAW filters, one approach is to use a "ring" configuration to redirect the bidirectional energy launched in two opposite directions from the transmitting, or input, transducer for being combined at the receiving, or output, transducer. Another approach is to use unidirectional transducers wherein the wave energy is launched or received in one direction for the input and output transducers. When an anisotropic material, such as ST quartz, serves as the piezoelectric substrate for the surface acoustic waves, the propogation characteristics are stable in one direction of transmission but not in the other generally orthogonal direction. In the latter situation, the ST quartz exhibits a temperature dependent, preferential direction of transmission which produces a temperature dependent signal attenuation in the operation of the SAW filter. This phenomemon is well known as discussed, for example, in a paper entitled "Phase Errors in Long Surface Wave Devices" by D. T. Bell, Jr. at page 420 of the I.E.E.E. Group on Sonics and Ultrasonics, Proceedings of Astrosonics Symposium, October 1972.

Unidirectional transducers are typically arranged so that the directional characteristics of the input and output transducers are aligned for being coupled together by launched surface waves travelling along a straight path. This straight path may then be advantageously oriented in the direction on the substrate surface exhibiting the most stable propagation characteristics during temperature changes. However, it is advantageous to change the direction of propagation of the surface waves on the piezoelectric substrate. For example, the change in direction increases the path length available from a given substrate size and is a requirement where density is a major consideration. One solution would be to house the SAW filter in a temperature controlled oven, but the additional control circuitry and the physical presence of the oven are costly and tend to defeat the high density objective. Conventional techniques accordingly do not provide a satisfactory solution to the introduction of the foregoing temperature dependent instability. It would be highly desirable to change the direction of propagation of surface waves in SAW filters in a manner wherein the effect of temperature dependent instability and temperature dependent signal attenuation are fully compensated.

BRIEF DESCRIPTION OF THE DRAWING

Features of the invention and additional objects of the invention will be more readily appreciated and better understood by reference to the following detailed description which should be considered in conjunction with the drawing.

SUMMARY OF THE INVENTION

A primary object of the invention is to provide temperature compensation in a reflector pair configuration of a SAW device to prevent signal instability associated with temperature dependent acoustic wave transmission in piezoelectric material.

Another object of the invention is to provide an arrangement for offsetting the non-uniform amplitude distribution across the reflected wave front.

Broadly, the invention includes a pair of grating reflectors in a SAW device wherein the reflectors are arranged to direct acoustic wave energy through a Z-path in piezoelectric material to compensate for the instability effects produced by a temperature dependent, preferential direction of transmission exhibited by the piezoelectric material.

In some of the additional aspects of the invention, unidirectional transducers are utilized for the input and output transducers of the SAW device. The grating reflectors include elements oriented in a first direction to provide the reflection. At least one grating reflector includes a non-reflective portion to offset the non-uniform amplitude distribution present across the wave front of the reflected acoustic wave. The non-reflective corner may comprise elements oriented in a second direction which is substantially normal to the first direction. The second grating reflector may also include a non-reflective portion to provide an offset for the non-uniform amplitude distribution present in the reflected wave redirected by the second grating reflector.

DETAILED DESCRIPTION

Figure 1:
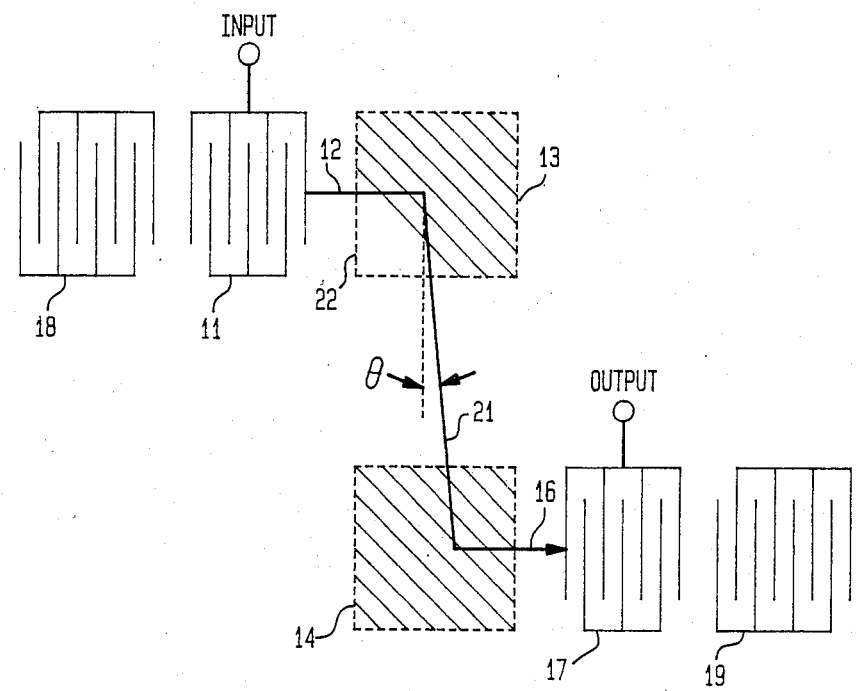
FIG. 1 is an illustrative embodiment of the invention principles applied to a SAW device.

FIG. 1 illustrates a "Z-type" configuration which demonstrates an illustrative embodiment of the inventive principles applicable in SAW filters. Basically, the SAW device comprises input transducer 11 which launchs a surface wave to propagate along line 12 in response to an input signal, surface wave reflectors 13 and 14 which direct the launched surface waves by double reflection to propagate along line 16 parallel to line 12, and output transducer 17 which receives the surface wave for conversion back into an electrical output signal. The foregoing components are all mounted on the surface of a piezoelectric substrate material which provides the surface wave propagation medium. The material of the substrate may be either ST quartz or YZ lithuim niobate which are conventional anisotropic media well characterized in the art. However, the principles of the invention should be understood to not be limited to such materials and are applicable to other materials.

Input transducer 11 is adapted to receive an electrical input signal for conversion into acoustic wave energy and is generally of the form known as an interdigital transducer (IDT). Acoustic waves generated by transducer 11 are launched on the side indicated by line 12. This is due to reflector 18 next to transducer 11 serving to collect the waves which would ordinarily propagate in the opposite direction. Thus, the arrangement of transducer 11 and reflector 18 function as a unidirectional transducer known as a group - type unidirectional IDT (GTIDT). Similarly, the arrangement of output transducer 17 and reflector 19 also serve as a GTIDT. It is to be understood, however, that any type of unidirectional or directional transducer may be used equally well to advantage. For example, multilayer or three phase transducers may be used if desired.

Also shown in FIG. 1 is an angle $\theta$ which indicates a temperature dependent, preferential direction of transmission which is known to result in a temperature dependent signal attenuation. The stable direction of transmission corresponds to the orientation of line 12 and this is ordinarily used such as in the case of straight path acoustic wave propagation provided by directional transducers. In the direction of line 21, the speed of transmission or propagation varies with temperature and also varies in direction as the value of the angle $\theta$ change. In the previously discussed ring configuration, the value of the angle $\theta$ essentially doubles so that the output transducer efficiency is significantly affected by both speed of the received acoustic wave and its angle of incidence.

However, in the arrangement of FIG. 1 the value of the angle $\theta$ produced by the first reflection from reflector 13 is compensated by the value of the angle produced by the second reflection produced by reflector 14. In other words, the two angles are of equal magnitude but of opposite phase or sign to provide a cancellation effect. As a result, the directional relationship between lines 12 and 16 is that they remain parallel independent of changes in temperature so that the efficiency of output transducer 17 is maintained at a constant value. Thus, the arrangement of FIG. 1 is able to provide a low insertion loss that remains stable during temperature changes.

In FIG. 1, the transmission path indicated by lines 12, 21 and 16 is greatly simplistic of the actual physical wave reflection phenomenon which occurs. A complicated phenomenon is produced by multiple reflections distributed over the plurality of elements within each of slant reflectors 13 and 14. As a result, a non-uniform amplitude distribution is exhibited across the reflected wave front. Since group - type interdigital transducer 17 produces its output by integrating the received acoustic energy, significant losses will occur from the non-uniform amplitude distribution. This problem also occurs in the ring or U-configuration slant reflectors discussed in the background of the invention, but the problem is more severe when the slant reflectors are arranged in a Z-configuration to provide temperature compensation according to FIG. 1. In addition to lowering efficiency, the non-uniformity of the amplitude distribution tends to produce a high concentration of wave energy which over time becomes self-destructive and shortens the life of the SAW device. Modification of the corner portion 22 of reflector 13 may offset the non-uniform amplitude distribution so as to produce a more even amplitude distribution across the reflected wave.

Figure 2:
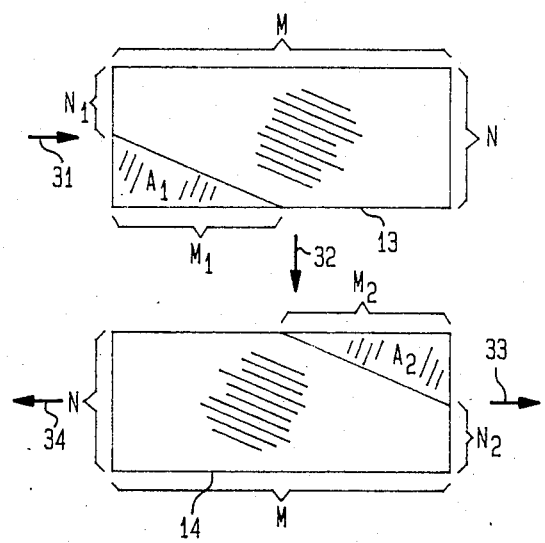
FIG. 2 illustrates a slant reflector pair for demonstrating various aspects of the inventive principles.

FIG. 2 illustrates two slant reflectors 13 and 14 for the purpose of exploring the non-uniform phase shift problem. In the case of the Z-configuration, the wave energy is reflected along the path indicated by arrows 31, 32, and 33. In the second case of the U-configuration (ring filter), the wave energy is reflected along the path indicated by arrows 31, 32 and 34. In the latter case, the orientation of the elements of slant reflectors 14 is perpendicular to the orientation of the elements of slant reflector 13. Representative elements are symbolically shown in FIG. 2 for the Z-configuration. It should be understood that the main portion of each of reflectors 13 and 14 for the U-configuration would include elements oriented according to FIG. 3.

Figure 3:
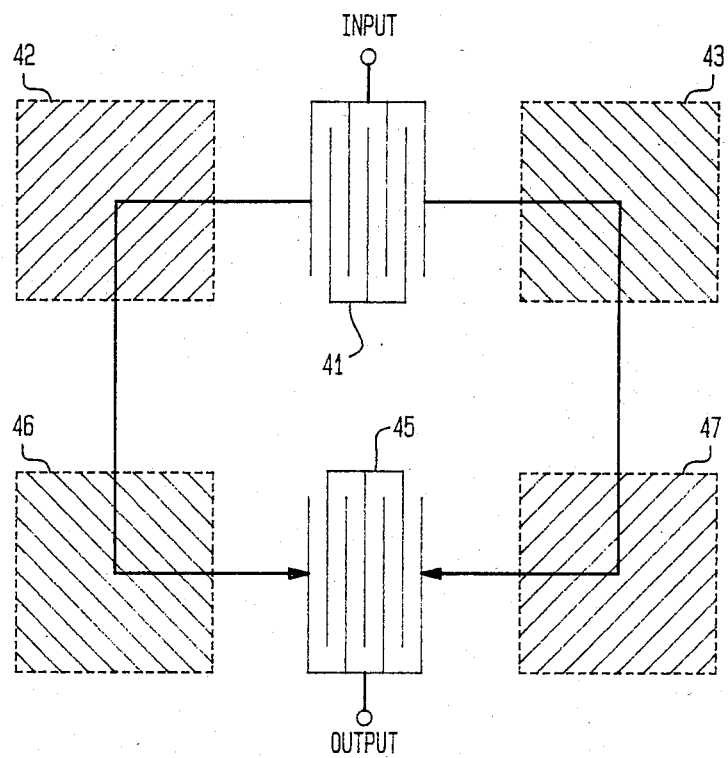
FIG. 3 depicts a typical ring configuration filter used as a basis of comparison in evaluating the performance of the invention.

FIG. 3 depicts a ring filter which actually includes two such U-configurations that point to each other wherein bidirectional input transducer 4 is located between two opposing legs of the U-configuration formed by reflectors 42 and 43. Similarly, output transducer 45 is located between the opposing legs of reflectors 46 and 47. In terms of the U-configuration, reflectors 42 and 46 form a first U while reflectors 43 and 47 form the second U.

FIG. 2 is shown generally to include both the U-configuration or the Z-configuration wherein each of reflectors 13 and 14 have array dimensions M, N. M x N are the number of nodes in each reflector. Each of the diagonal elements in reflectors 13 and 14 may be a strip of deposited overlay, for example, deposited metal or etched grooves which may be precisely formed by ion milling. When the substrate material is quartz, aluminum serves well as the metal for the strips. In either case, a reflection occurs at the leading edge of the element for the incident acoustic wave and another reflection occurs at the trialing edge. The spacing between two successive leading edges corresponds to an odd multiple of a wave length. The overall characteristic of a reflector is a summation of these multiple reflections. Simple recursive techniques may be used to produce an output signal vector (reflected output) by gradually developing from the input signal vector by moving through the reflector lattice row by row and adding incident input signals.

Figure 4:
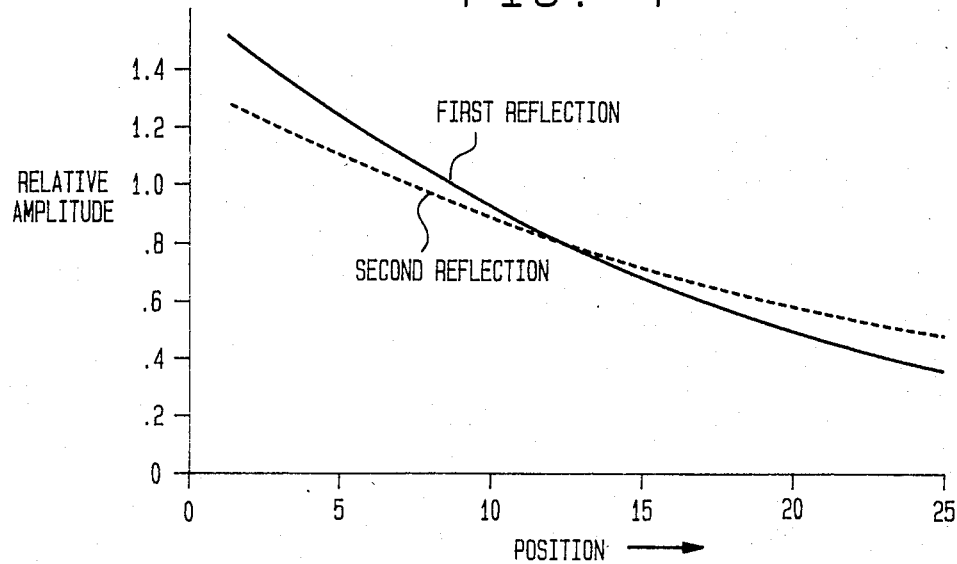
FIGS. 4 and 5 respectively show for a ring configuration filter relative amplitude for reflected wave energy and loss as a function frequency to provide a frequency response characteristic.
Figure 5:
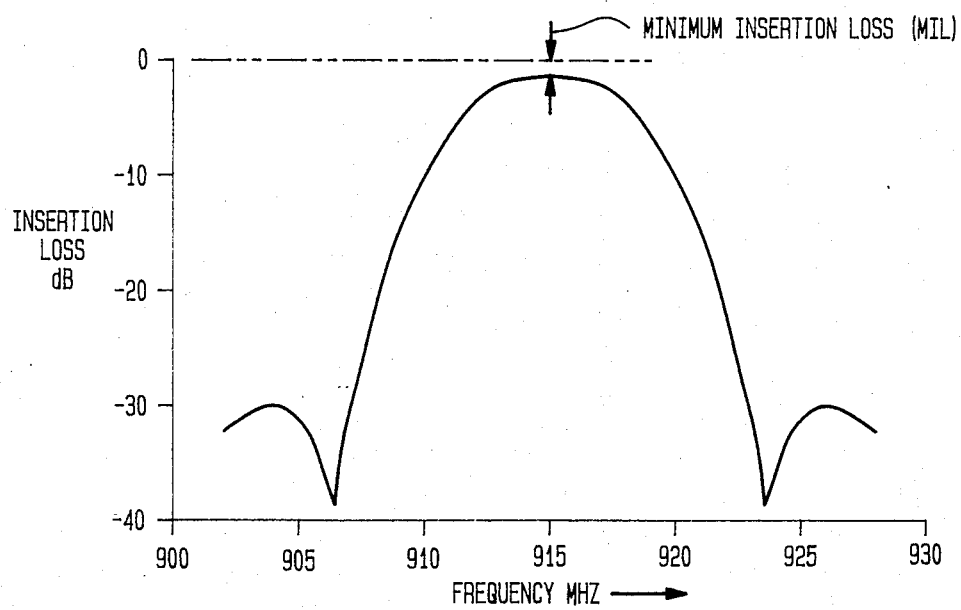

In FIG. 4, a relative amplitude distribution is shown for a typical cell dimension of three wavelengths where M=N=25. For FIG. 4, the node reflection was six percent, no internal loss was assumed. In FIG. 5, the frequency response is shown with a center frequency, $F_o$=915 Megahertz, and the minimum insertion loss was determined to be 1.75 dB. Both FIGS. 4 and 5 depict the results of the ring configuration according to FIG. 3.

Figure 6:
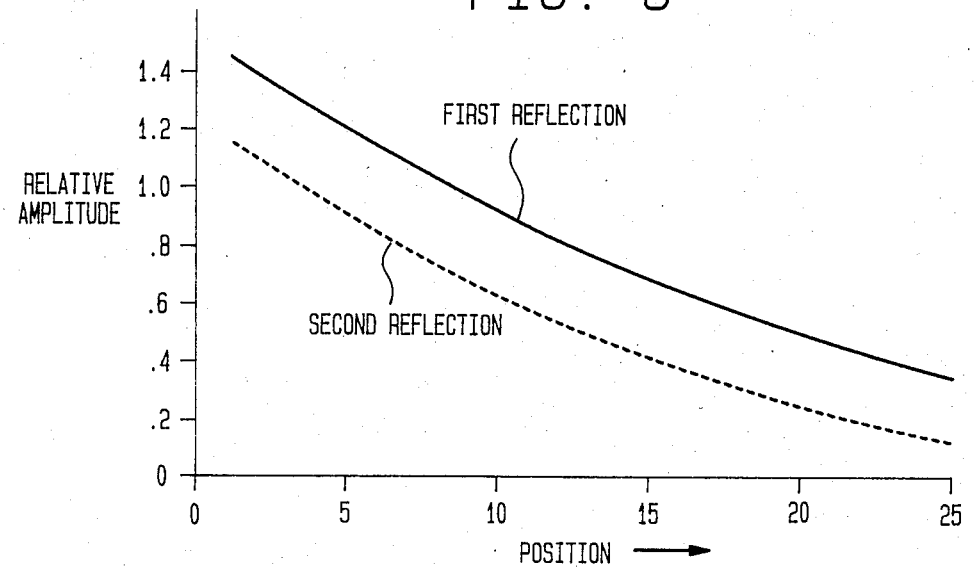
FIGS. 6 and 7 respectively illustrate for a Z-configuration of reflectors a relative amplitude distribution and frequency response characteristic.
Figure 7:
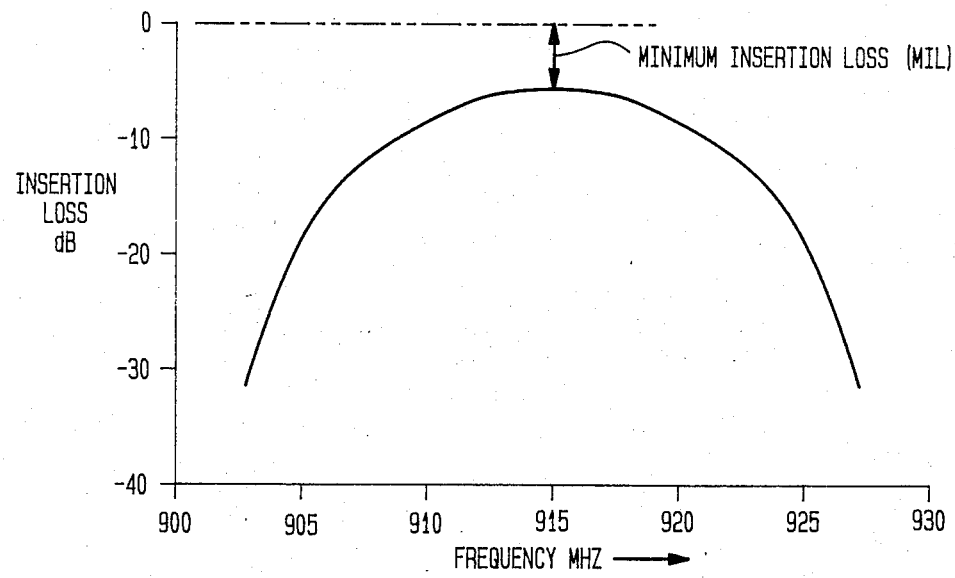

FIGS. 6 and 7 depict the same type of results for the Z-configuration. Here is should be noted that the second reflection produces an amplitude distribution across the aperture which is more non-uniform and generally of higher loss as evidenced by the space below the first reflection. FIG. 7 demonstrates the frequency response with a minimum insertion loss (MIL) of approximately 5 dB. In this case, the material loss factor produced a Q of 5000 which compares to a MIL=2.33 dB for the ring filter.

Figure 8:
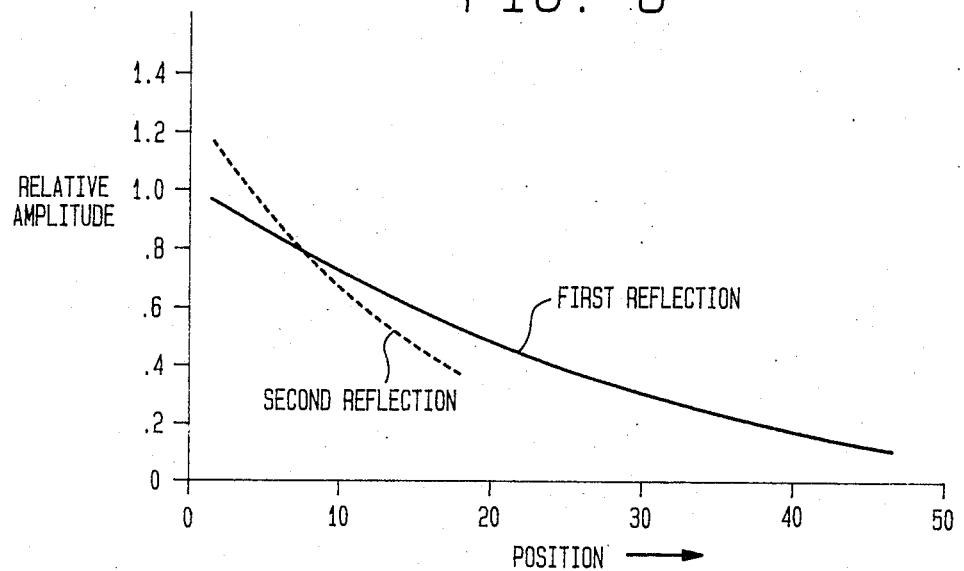
FIGS. 8 and 9 are respective graphs of reflected amplitude distribution and frequency response characteristic for a U-configuration of a pair of rectangular reflectors.
Figure 9:
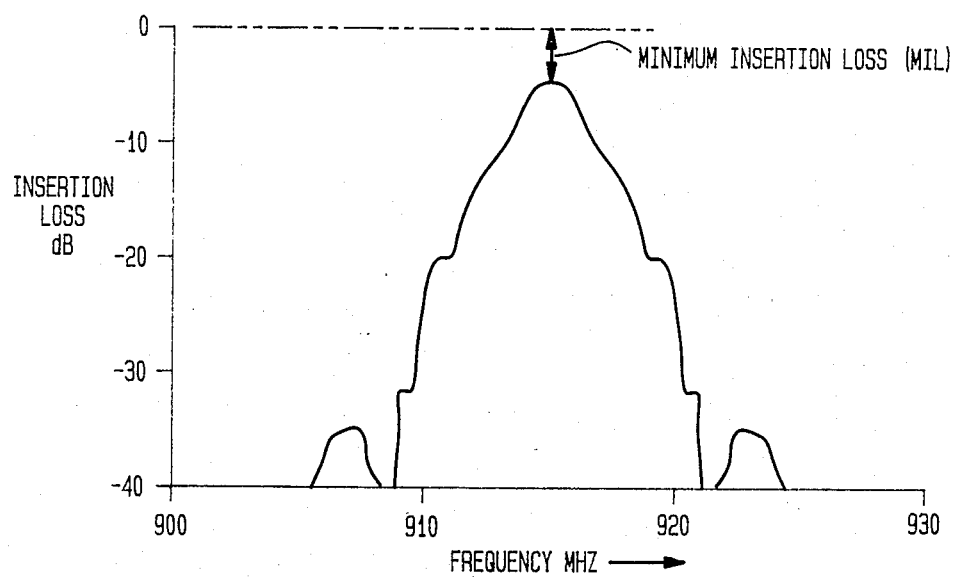
Figure 10:
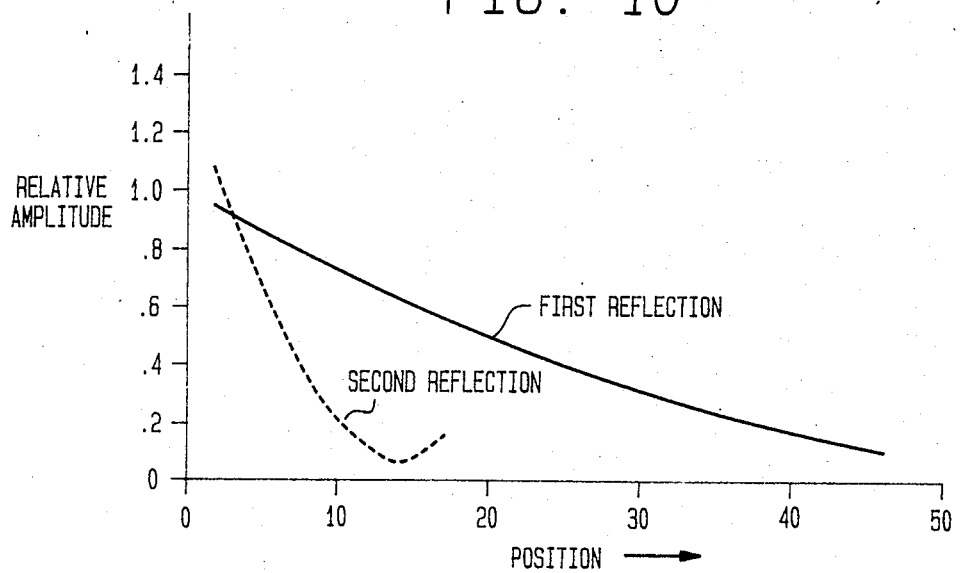
FIGS. 10 and 11 are respective graphs of reflected amplitude distribution and frequency response characteristic for a Z-configuration of rectangular reflectors with the same cell dimensions as those of the U-configuration of FIGS. 8 and 9.
Figure 11:
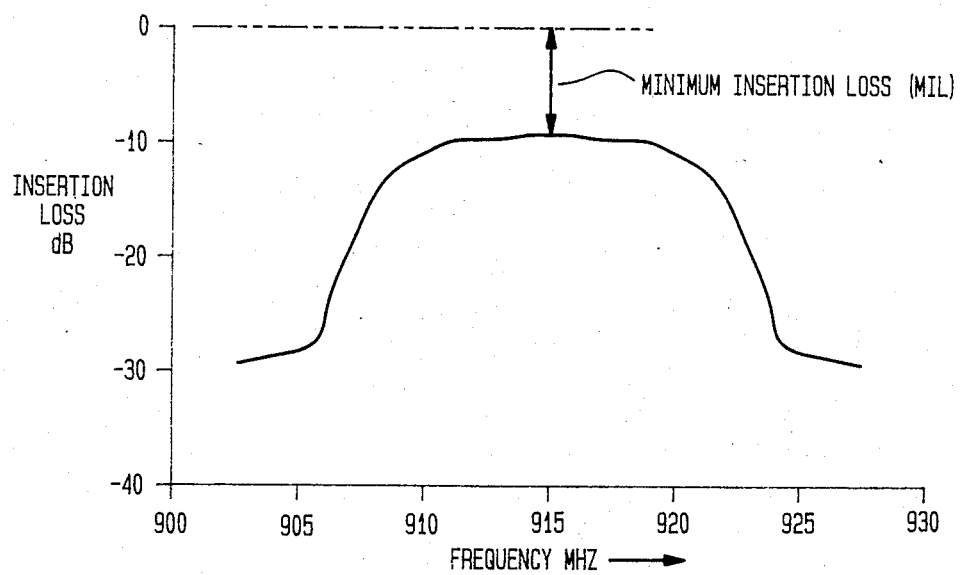

Other computational results demonstrating the performance of the reflector configurations are illustrated in FIGS. 8 and 9 for the ring or U-configuration as compared to FIGS. 10 and 11 for the Z-configuration. In this case, the M by N dimensioned array corresponds to 50 by 17 with a Q=5000 and a reflection coefficient of 0.06. The U-configuration provides a relatively narrow passband with a MIL of approximately 2.7 dB. The Z-configuration provides a much wider and flat passband, but a relatively high insertion loss of 9.5 dB. In order to achieve a lower insertion loss for the Z-configuration, it is necessary to provide a more uniform amplitude distribution across the aperture between the reflectors.

In accordance with an aspect of the invention, the shape of the reflective area is modified. Referring back to FIG. 2, area A of first reflector 13 and area $A_2$ of second reflector 14 are made non-reflecting. This may be achieved in two ways. First, elimination of the metal strips or reflective elements from these areas. Second, using strips or reflective elements oriented at a different angle such as perpendicularly. This second approach provides a constant metallization density, where the overlay deposition is used.

Typical dimensional parameters for the arrangement according to FIG. 3 were selected as follows:

Array dimension M=60, N=17
Non-reflective area $A_1$; $M_1=30$, $N_1=4$
Non-reflective area $A_2$; $M_2=8$, $N_2=15$
Cell dimension=6 wavelengths
Cell reflection=9%
Material loss (none) Q of infinity, and Q of 5000

Figure 12:
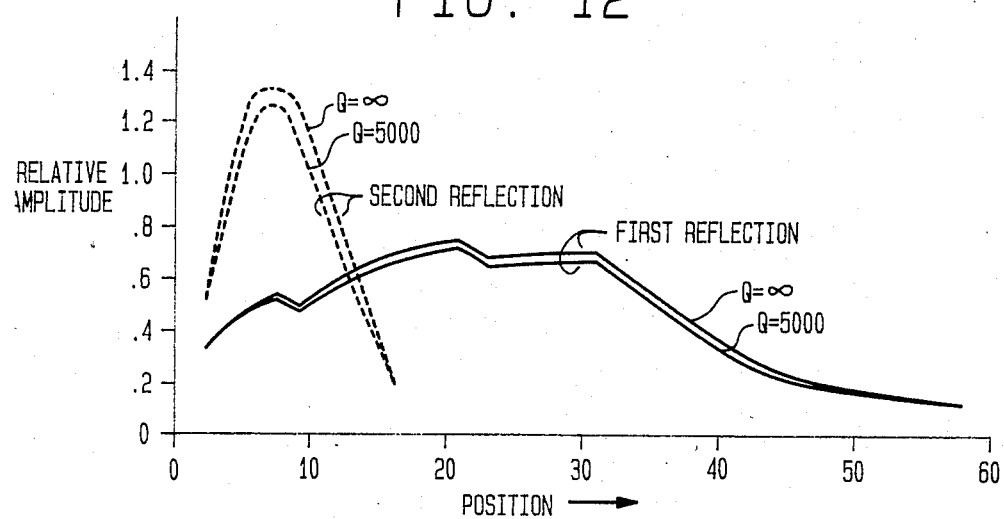
FIGS. 12 and 13 provide respective graphic results for a Z-configuration modified in accordance with the arrangement depicted in FIG. 2.

FIG. 12 shows the amplitude distribution after first and second reflections. It should be observed that the second reflection is relatively symmetrical with no phase shift across the aperture.

Figure 13:
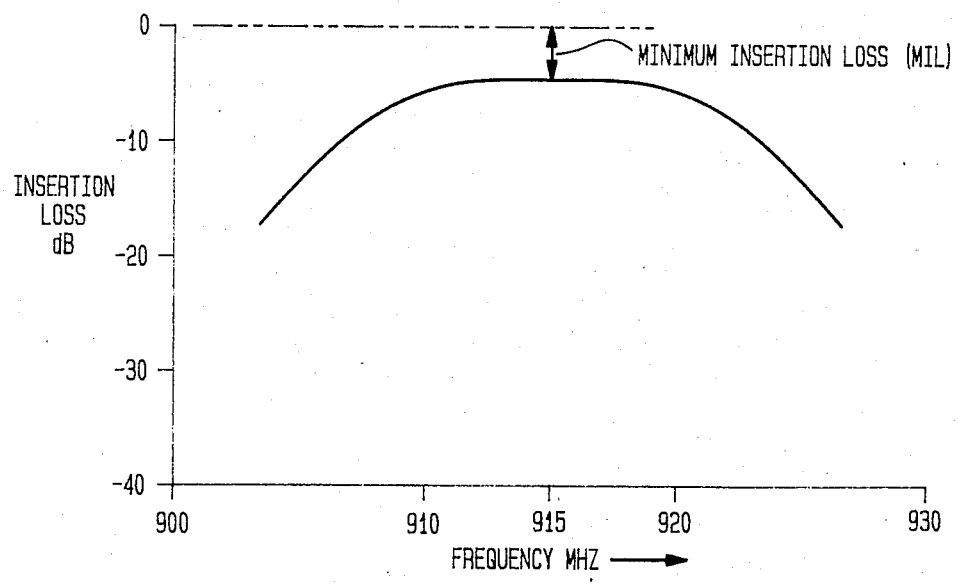

FIG. 13 illustrates the frequency response for two reflections. The MIL corresponds to about 1.95 dB for a Q of 5000 which is approximately the same value as that provided in the U-configuration. Here, however, the 3 dB passband is broader and is about 13.5 M Hz. In the U-configuration the bandwidth is primarily dependent on the M-dimension while the Z-configuration the bandwidth is basically dependent on the N-dimension.

There has thus been shown and described a novel configuration of reflectors in SAW devices for compensating for temperature effects and non-uniformity in amplitude distributions which fulfills all the objects and advantages sought therefor. Many changes, modifications, variations and other uses and applications of the subject invention will, however, become apparent to those skilled in the art after considering the specification and the accompanying drawings which disclose embodiments thereof. For example, the technique of weighting wherein the length of reflective elements is varied to shape the frequency response characteristic may be used to advantage while employing the inventive principles. Also the technique for offsetting non-uniformity in amplitude distribution using non-reflective portions is not limited to the type of reflectors or the reflector configurations described herein. All such changes, modifications, variations and other uses and applications which do not depart from the spirit and scope of the invention are deemed to be covered by the invention which is limited only by the claims which follow.

What is claimed is:

1. A surface acoustic wave (SAW) device of the type formed by a piezoelectric substrate having a substrate surface and at least two transducers disposed on said surface, said device comprising:
   a first grating reflector of elements in a first orientation for receiving a surface wave launched in a first direction by a first transducer of the at least two transducers and reflecting the surface wave in a second direction substantially perpendicular to the first direction, the propogation in the second direction being unstable due to temperature dependence exhibited by the material of the piezoelectric substrate;
   a second grating reflector of elements in a second orientation for receiving the surface wave reflected in the second direction and reflecting the surface wave into another direction parallel to the first direction for cancelling out the instability effects of the propogation in the second direction and toward a second transducer of the at least two transducers;
   the first grating reflector including a non-reflective corner for offsetting a non-uniform amplitude distribution present across the reflected wave front produced by the first grating reflector; and
   the non-reflective corner intersecting with the first grating reflector and forming a straight line obliquely oriented with respect to the first grating reflector.

2. The SAW of claim 1, wherein the first transducer comprises a unidirectional transducer for launching acoustic wave energy in a first direction directed to said first grating reflector.

3. The SAW devices of claim 1, wherein the second transducer is a unidirectional transducer for serving as an output for the device.

4. The SAW device of claim 1, wherein the first grating reflector includes an array of the elements in the form of linear elements spaced apart and parallel to each other oriented in the first orientation.

5. The SAW device of claim 4, wherein the non-reflective corner includes elements oriented to be non-reflective.

6. The SAW device of claim 5, wherein the elements of the reflective array and the non-reflective corner have the same element density.

7. The SAW device of claim 6, wherein the elements of the reflective array and the non-reflective corner comprise strips of metal overlay.

8. The SAW device of claim 7, wherein the strips of metal overlay comprise aluminum.

9. The SAW device of claim 8, wherein the elements of the reflective array and the non-reflective corner comprise grooves.

10. A surface acoustic wave (SAW) device of the type formed by a piezoelectric substrate having a substrate surface and at least two transducers disposed on said surface, said device comprising:
    a first grating reflector of elements in a first orientation for receiving a surface wave launched in a first direction by a first transducer of the at least two transducers and reflecting the surface wave in a second direction substantially perpendicular to the first direction, the propogation in the second direction being unstable due to temperature dependence exhibited by the material of the piezoelectric substrate;

a second grating reflector of elements in a second orientation for receiving the surface wave reflected in the second direction and reflecting the surface wave into another direction parallel to the first direction for cancelling out the instability effects of the propogation in the second direction and toward a second transducer of the at least two transducers;

the first grating reflector including a non-reflective corner for offsetting a non-uniform amplitude distribution present across the reflected wave front produced by the first grating reflector; and the non-reflective corner comprising elements whose orientation is generally normal with respect to the first orientation of elements of the first grating reflector.

11. A surface acoustic wave (SAW) device of the type formed by a piezoelectric substrate having a substrate surface and at least two transducers disposed on said surface, said device comprising:

a first grating reflector of elements in a first orientation for receiving a surface wave launched in a first direction by a first transducer of the at least two transducers and reflecting the surface wave in a second direction substantially perpendicular to the first direction, the propogation in the second direction being unstable due to temperature dependence exhibited by the material of the piezoelectric substrate;

a second grating reflector of elements in a second orientation for receiving the surface wave reflected in the second direction and reflecting the surface wave into another direction parallel to the first direction for cancelling out the instability effects of the propogation in the second direction and toward a second transducer of the at least two transducers;

the first grating reflector including a non-reflective corner for offsetting a non-uniform amplitude distribution present across the reflected wave front produced by the first grating reflector;

the second grating reflector includes a non-reflective corner for offsetting the non-uniform phase shift present across the reflected wave front produced by the second grating reflector; and the non-reflective corner intersecting with the first grating reflector and forming a straight line obliquely oriented with respect to the first grating reflector.

12. The SAW device of claim 11, wherein the first grating reflector includes a non-reflective corner for offsetting a non-uniform amplitude distribution present across the reflected wave front produced by the first grating reflector.

13. The SAW device of claim 12, wherein the non-reflective corner of the first grating reflector occupies a corner that is located diagonally opposite to the non-reflective corner of the second grating reflector with respect to the geometrical shape of its reflector.

14. The SAW device of claim 13, wherein the elements of the first and second grating reflectors comprises strips of metal overlay.

15. The SAW device of claim 13, wherein the elements of the first and second grating reflectors comprise etched grooves.

* * * * *